United States Patent
Jaquette et al.

(10) Patent No.: US 8,375,064 B2
(45) Date of Patent: Feb. 12, 2013

(54) APPARATUS, SYSTEM, AND METHOD FOR READ BACK VERIFICATION OF STORED DATA

(75) Inventors: Glen Alan Jaquette, Tucson, AZ (US); Thomas Mittelholzer, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 1610 days.

(21) Appl. No.: 11/381,905

(22) Filed: May 5, 2006

(65) Prior Publication Data

US 2007/0260623 A1 Nov. 8, 2007

(51) Int. Cl.
*G06F 17/30* (2006.01)
(52) U.S. Cl. ......... 707/803; 713/189; 713/193; 714/758
(58) Field of Classification Search .................. None
See application file for complete search history.

(56) References Cited

U.S. PATENT DOCUMENTS

| | | | | |
|---|---|---|---|---|
| 5,167,034 | A | 11/1992 | MacLean, Jr. et al. | 395/575 |
| 5,978,805 | A * | 11/1999 | Carson | 707/10 |
| 6,058,462 | A | 5/2000 | West et al. | 711/162 |
| 6,189,124 | B1 * | 2/2001 | Glaise | 714/758 |
| 6,442,659 | B1 * | 8/2002 | Blumenau | 711/162 |
| 6,467,060 | B1 | 10/2002 | Malakapalli et al. | 714/758 |
| 6,766,493 | B1 * | 7/2004 | Hoffman et al. | 714/785 |
| 2003/0140299 | A1 | 7/2003 | Duncan et al. | 714/763 |
| 2004/0123202 | A1 | 6/2004 | Talagala et al. | 714/736 |
| 2004/0205441 | A1 * | 10/2004 | Oren | 714/758 |

* cited by examiner

*Primary Examiner* — John E Breene
*Assistant Examiner* — Andalib Lodhi
(74) *Attorney, Agent, or Firm* — Kunzler Law Group, PC

(57) ABSTRACT

An apparatus, system, and method are disclosed for read back verification of stored data. A file CRC module calculates a first file CRC for a data file. A segmentation module segments the data file into a plurality of data blocks that comprise a copy of the data file. A block CRC module calculates a data block CRC for each data block. An aggregated CRC module calculates a second file CRC from the data block CRCs. In addition, the aggregated CRC module verifies copy of the data file if the second file CRC is substantially equivalent to the first file CRC.

18 Claims, 8 Drawing Sheets

APPARATUS, SYSTEM, AND METHOD FOR READ BACK VERIFICATION OF STORED DATA

BACKGROUND OF THE INVENTION

1. Field of the Invention

This invention relates to data verification and more particularly relates to read back verification of stored data.

2. Description of the Related Art

A data processing system may often copy significant quantities of data to storage devices. The data processing system may store the data to an archival copy of the data. In a prophetic example, the data processing system may store archival versions of digitized print, photographic, film, and/or audio media. Alternatively, the data processing system may store the data as a backup copy.

A user of the data processing system may require verification that the copied data is a faithful copy of the original data. To verify that the copied data is a faithful copy, a storage device may read the copied data as it is written to the storage device using a read-while-write process. The read-while-write process confirms that the data is written to the storage device just as the data is received by the storage device. Unfortunately, the read-while-write process does not check for errors transmitting the data to the storage device. In addition, the written data may be corrupted by subsequent writes.

As a result, the user may require that the data processing system read the copied data back from the storage device and compare the copied data to the original data to verify that the copied data represents a faithful copy. Such a read back verification process assures that the data is copied completely and accurately. Unfortunately, reading back and comparing the copied data with the original data requires significant communications and processing bandwidth, particularly when significant quantities of data are copied to the storage device. Requiring that the data processing system to read back and compare all of the copied data can significantly increase the cost of storage and communication devices for the data processing system.

From the foregoing discussion, it should be apparent that a need exists for an apparatus, system, and method that perform reduced bandwidth read back verification. Beneficially, such an apparatus, system, and method would verify that data is completely and accurately copied while reducing bandwidth demands on the data processing system.

SUMMARY OF THE INVENTION

The present invention has been developed in response to the present state of the art, and in particular, in response to the problems and needs in the art that have not yet been fully solved by currently available read back verification methods. Accordingly, the present invention has been developed to provide an apparatus, system, and method for read back verification that overcome many or all of the above-discussed shortcomings in the art.

The apparatus for read back verification of stored data is provided with a plurality of modules configured to functionally execute the steps of calculating a first file cyclic redundancy check (CRC) for a data file, segmenting the data file into data blocks, calculating data block CRCs, calculating a second file CRC from the data block CRCs, and verifying the copy of the data file. These modules in the described embodiments include a file CRC module, a segmentation module, a block CRC module, and an aggregated CRC module. In addition, the apparatus may include storage module and a data channel.

The file CRC module calculates a first file CRC for a data file. The data file is to be stored on a storage device. In one embodiment, the file CRC module calculates the first file CRC as a linear checksum. In addition, the first file CRC module may store the first file CRC in the storage module.

The segmentation module segments the data file into a plurality of data blocks. In one embodiment, the size of the data blocks is fixed. For example, each data block may comprise two megabytes (2 MB) of data. In an alternate embodiment, the segmentation module segments the data file into data blocks of variable sizes.

The block CRC module calculates a data block CRC for each data block. In addition, the block CRC module may append each data block CRC to the corresponding data block. The block CRC module may employ an algorithm used by the file CRC module to calculate the first file CRC in calculating the data block CRCs. In one embodiment, block CRC module calculates each data block CRC as a linear checksum.

In one embodiment, the data channel writes each data block with appended data block CRC to a storage medium of the storage device as a copy of the data file. For example, the data channel may write the data blocks with appended data block CRCs to magnetic tape of a tape drive. The data channel may further read the data block CRCs from the storage medium. The data channel may be an element of the storage device.

The aggregated CRC module calculates a second file CRC from the data block CRCs. In one embodiment, the aggregated CRC module employs Galois field math to calculate the second file CRC. The aggregated CRC module further verifies the copy of the data file if the second file CRC is substantially equivalent to the first file CRC. In a certain embodiment, the aggregated CRC module verifies the data file copy if the second file CRC is equal to zero (0). The apparatus performs a read back verify of the copy of the data file while communicating a minimum of data from storage device.

A system of the present invention is also presented for read back verification. The system may be embodied in a storage subsystem. In particular, the system, in one embodiment, includes a storage controller and a storage device.

The storage controller is configured to write data to and read data from the storage device. The storage controller receives a data file that is to be stored as a copy on the storage device. In addition, the storage controller includes a file CRC module, a storage module, a segmentation module, and an aggregated CRC module.

The file CRC module calculates a first file CRC for the data file and stores the first file CRC to the storage module. The segmentation module segments the data file into a plurality of data blocks.

The storage device includes a storage medium, a block CRC module and a data channel. The block CRC module calculates a data block CRC for each data block and appends each data block CRC to the corresponding data block. The data channel writes each data block with appended data block CRC to the storage medium. In addition, the data channel reads the data block CRCs from the storage medium.

The aggregated CRC module calculates a second file CRC from the block CRCs read by the data channel from the storage medium. In addition, the aggregated CRC module verifies the copy of the data file if the second file CRC is substantially equivalent to the first file CRC. The system verifies the copy of the data file stored on the storage device using a read back verify process that reduces data communication.

A method of the present invention is also presented for read back verification of stored data. The method in the disclosed embodiments substantially includes the steps to carry out the functions presented above with respect to the operation of the described apparatus and system. In one embodiment, the method includes calculating a first file CRC for a data file, segmenting the data file into data blocks, calculating data block CRCs, calculating a second file CRC from the data block CRCs, and verifying the copy of the data file.

A file CRC module calculates a first file CRC for a data file. A segmentation module segments the data file into a plurality of data blocks that comprise a copy of the data file. A block CRC module calculates a data block CRC for each data block. An aggregated CRC module calculates a second file CRC from the data block CRCs. In addition, the aggregated CRC module verifies copy of the data file if the second file CRC is substantially equivalent to the first file CRC. The method performs a read back verify of the data file copy that reduces the communications and processing bandwidth required for the verification.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The embodiment of the present invention verifies a data file copy using a read back verify process with reduced communications and processing bandwidth requirements. In addition, the embodiment of the present invention may reduce the size and cost of a storage subsystem required to support read back verification. These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, custom ASIC, or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Figure 1:
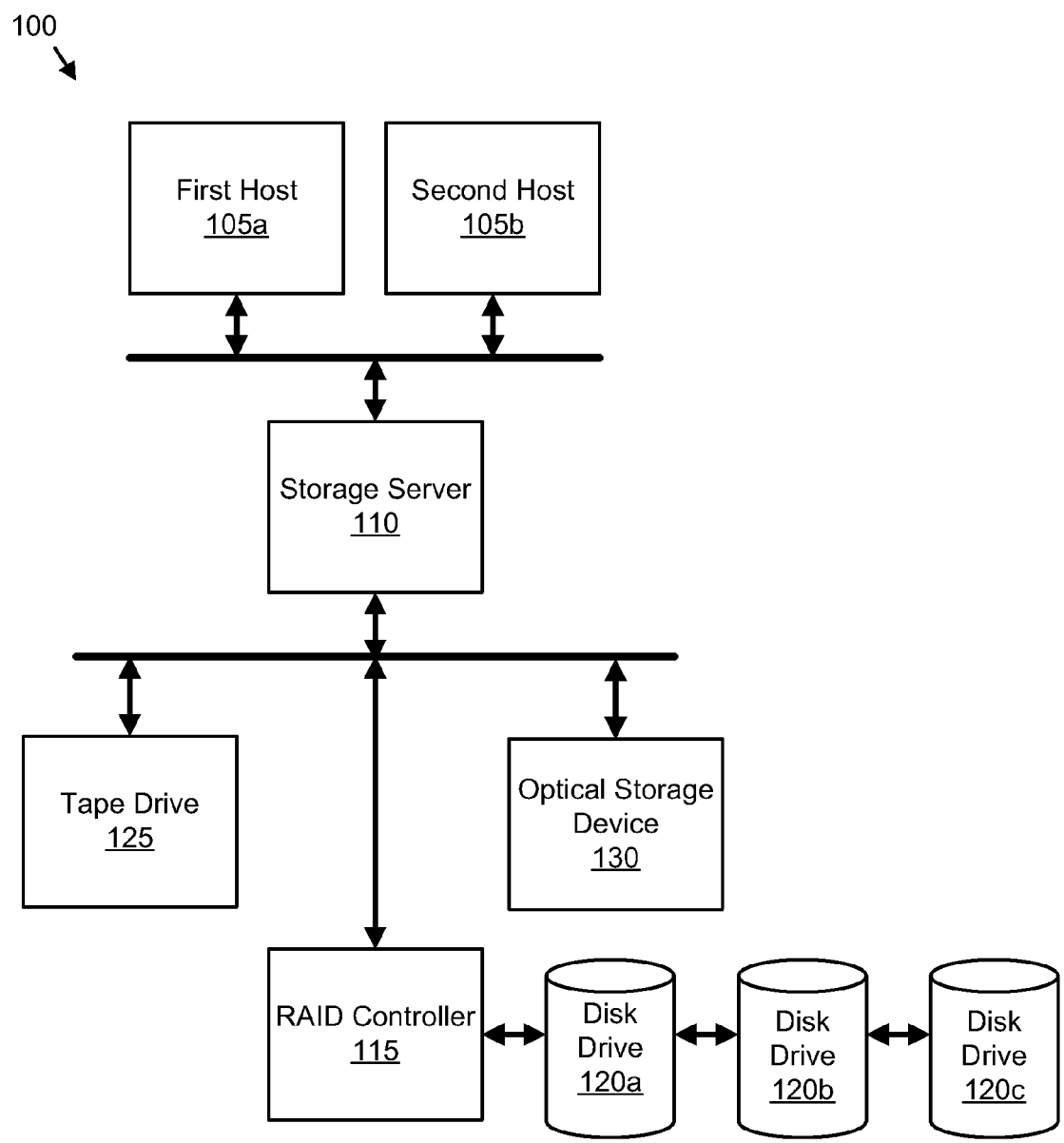
FIG. 1 is a schematic block diagram illustrating one embodiment of a data processing system of the present invention.

FIG. 1 is a schematic block diagram illustrating one embodiment of a data processing system 100 of the present invention. The system 100 includes one or more hosts 105, a storage server 110, a tape drive 125, a redundant array of independent disks (RAID) controller 115, one or more disk drives 120, and an optical storage device 130.

The tape drive 125, RAID controller 115 with disk drives 120, and the optical storage device 130 may be generically referred to storage devices. Although for simplicity the system 100 is depicted with two hosts 105, one storage server 110, one tape drive 125, one RAID controller 115, three disk drives 120 and one optical storage device 130, any number of hosts 105, storage servers 110, tape drives 125, RAID controllers 115, disk drives 120, and optical storage devices 130 may be employed. In addition, alternate embodiments of the system 100 may include micromechanical storage devices, semiconductor-based storage devices, routers, bridges, and the like as is well known to those skilled in the art.

In one embodiment, the storage server 110, tape drive 125, RAID controller 115, disk drives 120, and optical storage device 130 comprise a storage subsystem. In a certain embodiment, the storage subsystem is configured as storage area network.

The hosts 105 may be servers, mainframe computers, computer workstations, or the like. The hosts 105 may store data to and retrieve data from the tape drive 125, the RAID controller 115, and the optical storage device 130. In one embodiment, the RAID controller 115 stores the data as redundant data to the disk drives 120.

The storage server 110 may manage the communication of data between the hosts 105 and the tape drive 125, RAID controller 115, and optical storage device 130. In addition, the storage server 110 may manage the tape drive 125, RAID controller 115 and optical storage device 130. In a prophetic example, the storage server 110 may direct that a magnetic tape be mounted on the tape drive 125 to receive data.

In one prophetic example, the host 105 may copy a data file to the tape drive 125. In addition, the host 105 may direct that the copy of the data file be read back and compared with the data file to verify that the data file copy is equivalent to the data file. In the past, the read back verify required that the entirety of the data file copy be read from the tape drive 125 and compared with the data file by the host 105 and/or storage server 110.

Unfortunately, reading back the data file copy can consume significant communications and processing resources within the storage subsystem and the data processing system 100. The embodiment of the present invention performs a read back verification of the data file copy with reduced communications and processing resources as will be explained hereafter.

Figure 2:
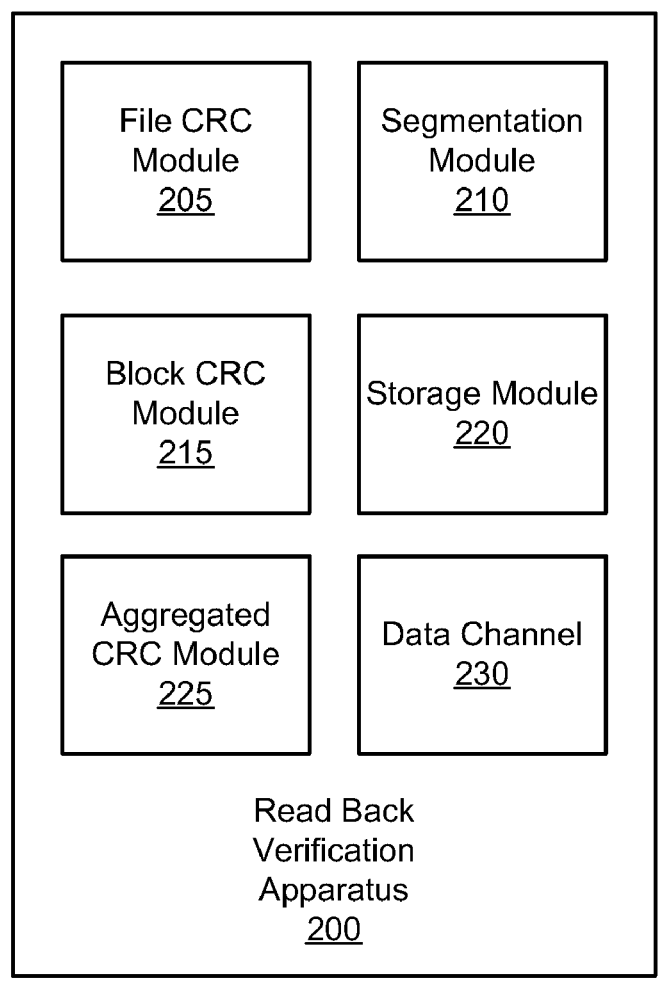
FIG. 2 is a schematic block diagram illustrating one embodiment of a data read back verification apparatus of the present invention.

FIG. 2 is a schematic block diagram illustrating one embodiment of a data read back verification apparatus 200 of the present invention. The apparatus 200 may be embodied in the data processing system 100 of FIG. 1. In addition, the description of the apparatus refers to elements of FIG. 1, like numbers referring to like elements. The apparatus 200 includes a file CRC module 205, a segmentation module 210, a block CRC module 215, and an aggregated CRC module 225. In one embodiment, the apparatus 200 also includes a storage module 220 and a data channel 230.

The file CRC module 205 calculates a first file CRC for a data file as will be described hereafter. The data file may be configured to be stored as a data file copy on a storage device such as the tape drive 125 and/or the optical storage device 130 of FIG. 1. The file CRC module 205 may employ an algorithm to calculate the file CRC. In one embodiment, the host 105 includes the file CRC module 205. Alternatively, the storage server 110 may include the file CRC module 205. In a certain embodiment, a storage device such as the RAID controller 115 comprises the file CRC module 205.

The file CRC module 205 may store the first file CRC in the storage module 220. In one embodiment, the storage module 220 may be a data register such as data register of the storage server 110. Alternatively, the storage module 220 may be a storage medium of a storage device. In a prophetic example, the first file CRC is written to a magnetic tape storage medium.

The segmentation module 210 segments the data file into a plurality of data blocks as will be described hereafter. In one embodiment, the size of the data blocks is fixed. For example, each data block may comprise two megabytes (2 MB) of data. In an alternate embodiment, the segmentation module 210 segments the data file into data blocks of variable sizes.

In one embodiment, the segmentation module 210 is embodied in the storage server 110. Alternatively, the segmentation module 210 may be embodied in a storage controller that will be described hereafter.

The block CRC module 215 calculates a data block CRC for each data block. In one embodiment, the block CRC module 215 may employ the algorithm used by the file CRC module to calculate the first file CRC in calculating the data block CRCs. In addition, block CRC module 215 may append each data block CRC to the corresponding data block.

The storage device may include the data channel 230. In one embodiment, the data channel 230 writes each data block with appended data block CRC to the storage medium as the copy of the data file. In addition, the data channel 230 may read the data block CRCs from the storage medium.

The aggregated CRC module 225 calculates a second file CRC from the block CRCs as will be described hereafter. In one embodiment, the aggregated CRC module 225 employs Galois field math to calculate the second file CRC. The aggregated CRC module 225 further verifies the copy of the data file if the second file CRC is substantially equivalent to the first file CRC. The apparatus 200 performs a read back verify of the copy of the data file while communicating a minimum of data.

Figure 3:
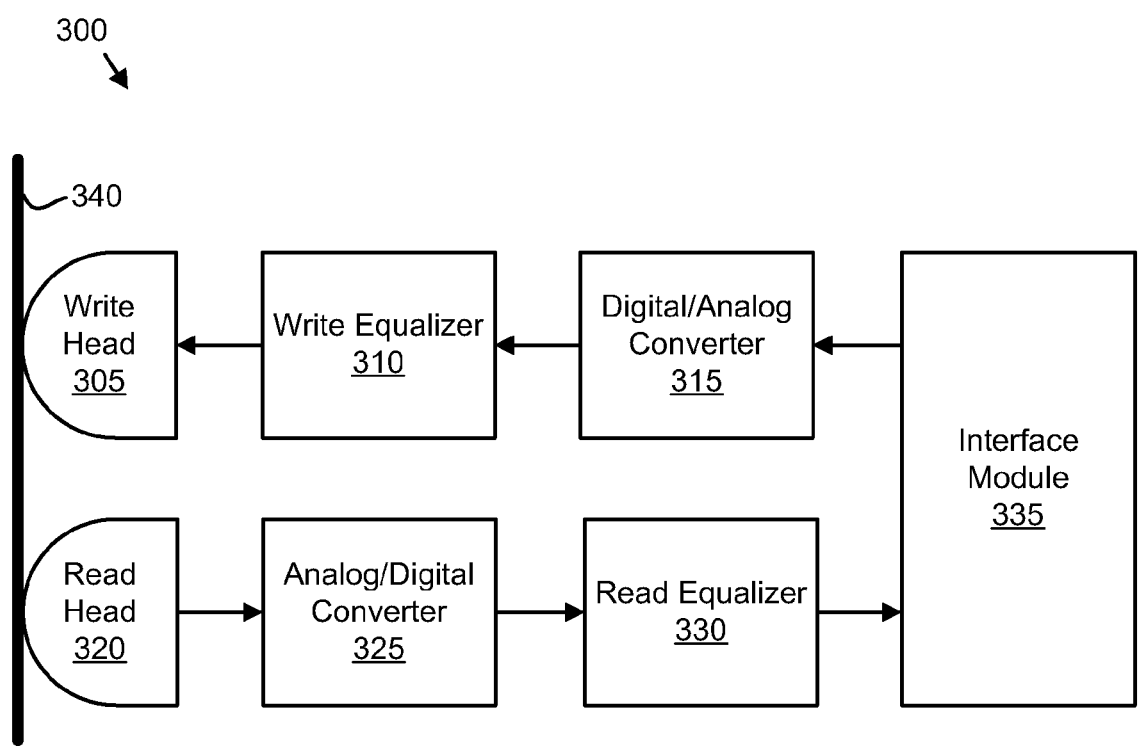
FIG. 3 is a schematic block diagram illustrating one embodiment of a data channel of the present invention.

FIG. 3 is a schematic block diagram illustrating one embodiment of a data channel 300 of the present invention. The description of the data channel 300 refers to elements of FIGS. 1-2, like numbers referring to like elements. As depicted, the data channel 300 is a prophetic example of a data channel 230 of the tape drive 125.

The data channel 300 includes a magnetic tape 340, a write head 305, a write equalizer 310, a digital/analog converter (DAC) 315, a read head 320, an analog/digital converter (ADC) 325, a read equalizer 330, and an interface module 335. The interface module 335 receives digital data such as bits comprising a data block. The DAC 315 may convert the data into an analog signal as is well known to those skilled in the art. The write equalizer 310 shapes the analog signal. The write head 305 magnetically encodes the analog signal on the magnetic tape 340.

The read head 320 retrieves the magnetically encoded analog signal from the magnetic tape 340 as an analog read signal. The ADC 325 converts the analog read signal into a digital representation of the analog read signal. The read equalizer 330 shapes the digital representation. In one embodiment, the interface module 335 may convert the digital representation into digital data as is well known to those skilled in the art. In one embodiment, the interface module 335 employs adaptive maximum likelihood detection to convert the digital representation into digital data.

Figure 4:
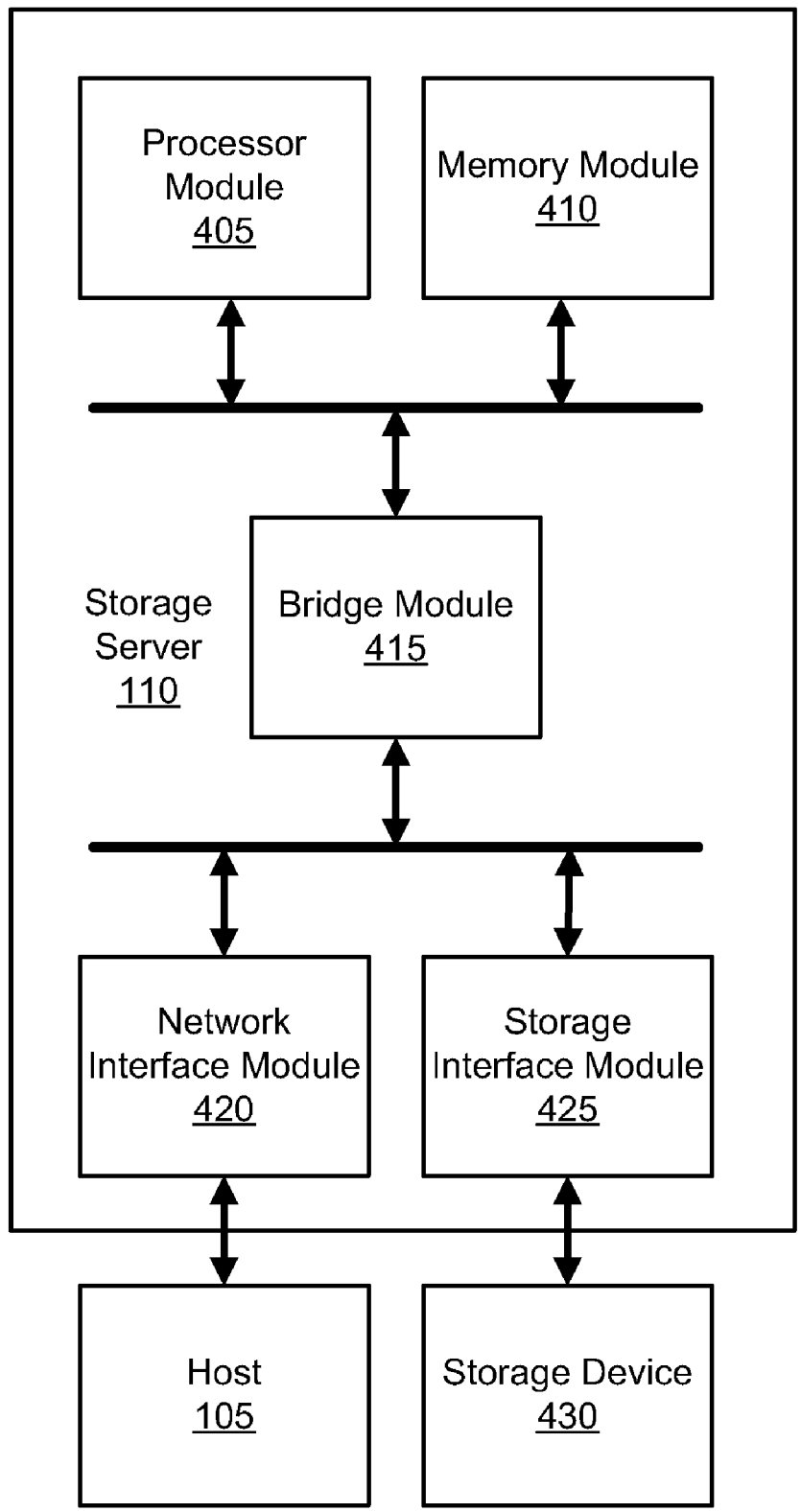
FIG. 4 is a schematic block diagram illustrating one embodiment of a storage server of the present invention.

FIG. 4 is a schematic block diagram illustrating one embodiment of a storage server 110 of the present invention. The storage server 110 may be the storage server 110 of FIG. 1. In addition, the description of the storage server 110 may refer to element of FIGS. 1-3, like numbers referring to like elements. In the depicted embodiment, the storage server 110 includes a processor module 405, a memory module 410, a bridge module 415, a network interface module 420, and a storage interface module 425. In addition, the storage server 110 is shown in communication with the host 105 and a storage device 430. The storage device 430 will be described hereafter in FIG. 5.

The processor module 405, memory module 410, bridge module 415, network interface module 420, and storage interface module 425 may be fabricated of semiconductor gates on one or more semiconductor substrates. Each semiconductor substrate may be packaged in one or more semiconductor devices mounted on circuit cards. Connections between the processor module 405, the memory module 410, the bridge module 415, the network interface module 420, and the storage interface module 425 may be through semiconductor metal layers, substrate to substrate wiring, circuit card traces, and/or wires connecting the semiconductor devices.

The memory module 410 stores software instructions and data. The processor module 405 executes the software instructions and manipulates the data as is well know to those skilled in the art. The processor module 405 communicates with the network interface module 420 and the storage interface module 425 through the bridge module 415.

In one embodiment, the memory module 410 may store and the processor module 405 may execute one or more software processes comprising the file CRC module 205, the segmentation module 210, and the aggregated CRC module 225. In a certain embodiment, the memory module 410 may also store and the processor module 405 may execute one or more software processes comprising the block CRC module 215.

Figure 5:
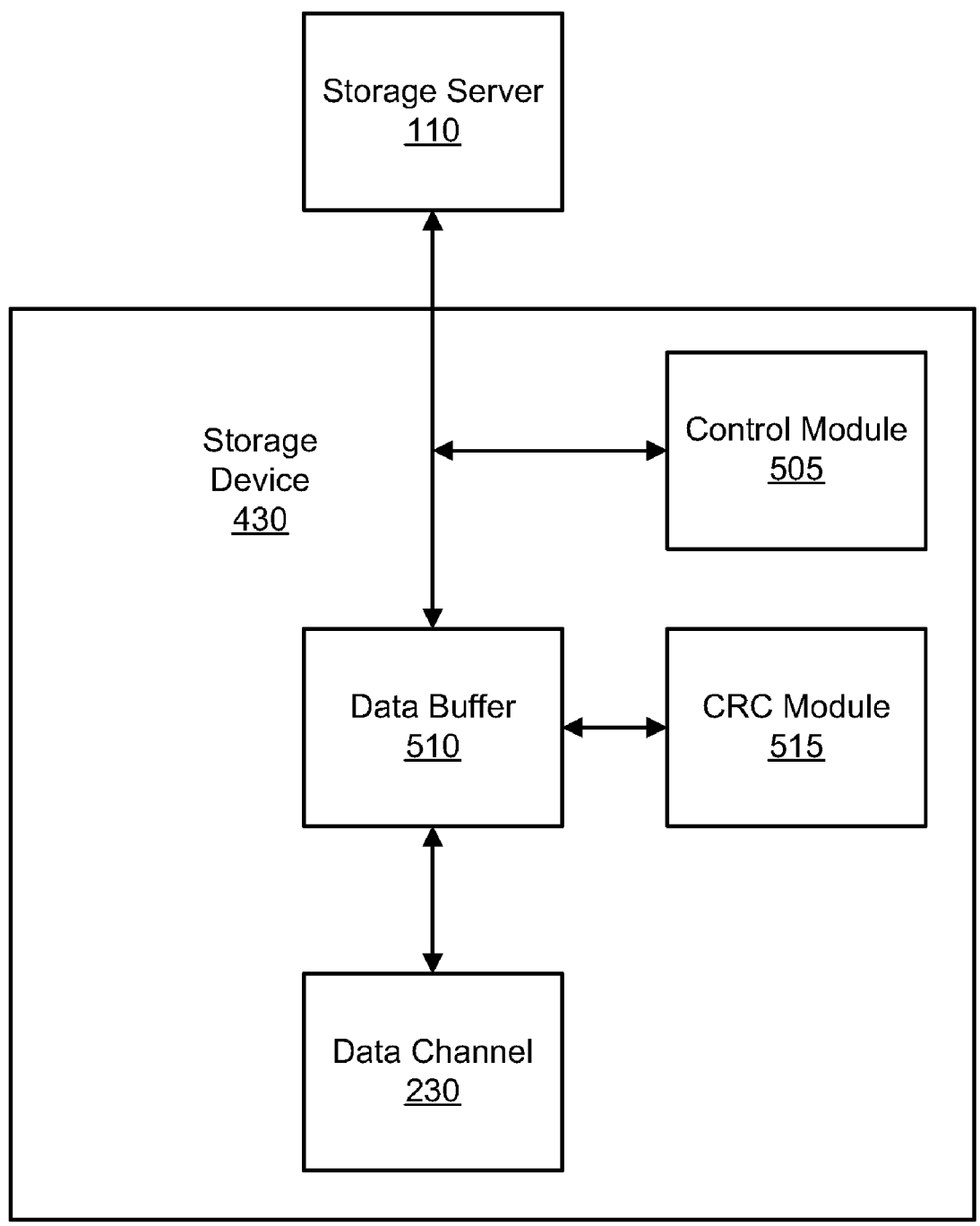
FIG. 5 is a schematic block diagram illustrating one embodiment of a storage device of the present invention.

FIG. 5 is a schematic block diagram illustrating one embodiment of a storage device 430 of the present invention. The storage device 430 may embody the tape drive 125, the RAID controller 115 and disk drives 120, and/or the optical storage device 130 of FIG. 1. The description of the storage device 430 refers to elements of FIGS. 1-4, like numbers referring to like elements. The storage device 430 includes a control module 505, a data buffer 510, and a CRC module 515. In addition, the storage device 430 is shown in communication with the storage server 110 of FIGS. 1 and 4. The control module 505 and the CRC module 515 may be configured as a storage controller.

The storage device 430 receives data from the storage server 110. The control module 505 may manage the receipt of the data. In one embodiment, the control module 505 communicates to the storage server 110 that the data is received. The data buffer 510 may store the data. In one embodiment, the data buffer 510 stores the data until the data is written to the data channel 230.

The data channel 230 writes the data from the data buffer 510 to a storage medium such as magnetic tape, an optical disk, and/or a hard disk drive. The data channel 230 may also read data from the storage medium and communicate the read data to the data buffer 510. The control module 505 may direct the data buffer 510 to communicate the read data to the storage server 110.

In one embodiment, the CRC module 515 comprises a plurality of semiconductor gates configured to perform one or more mathematical and/or logical operations as is well known to those skilled in the art. In a certain embodiment, the CRC module 515 comprises the block CRC module 215 and is configured to receive a data block and calculate a data block CRC for the data block. In addition, the CRC module 515 may be configured to append the data block CRC to the data block and communicate the data block with the data block CRC to the data buffer 510. The data buffer 510 may then communicate the data block with appended data block CRC to the data channel 230. The data channel 230 may write the data blocks and data block CRCs to the storage medium.

The CRC module 515 may also comprise the aggregated CRC module 225. In one embodiment, the data channel 230 may read a plurality of data block CRCs from the storage medium and communicate the data block CRCs to the data buffer 510. Under the direction of the control module 505, the CRC module 515 may calculate a second file CRC for the data block CRCs as an aggregated CRC as will be described hereafter.

The schematic flow chart diagram that follows is generally set forth as a logical flow chart diagram. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Figure 6:
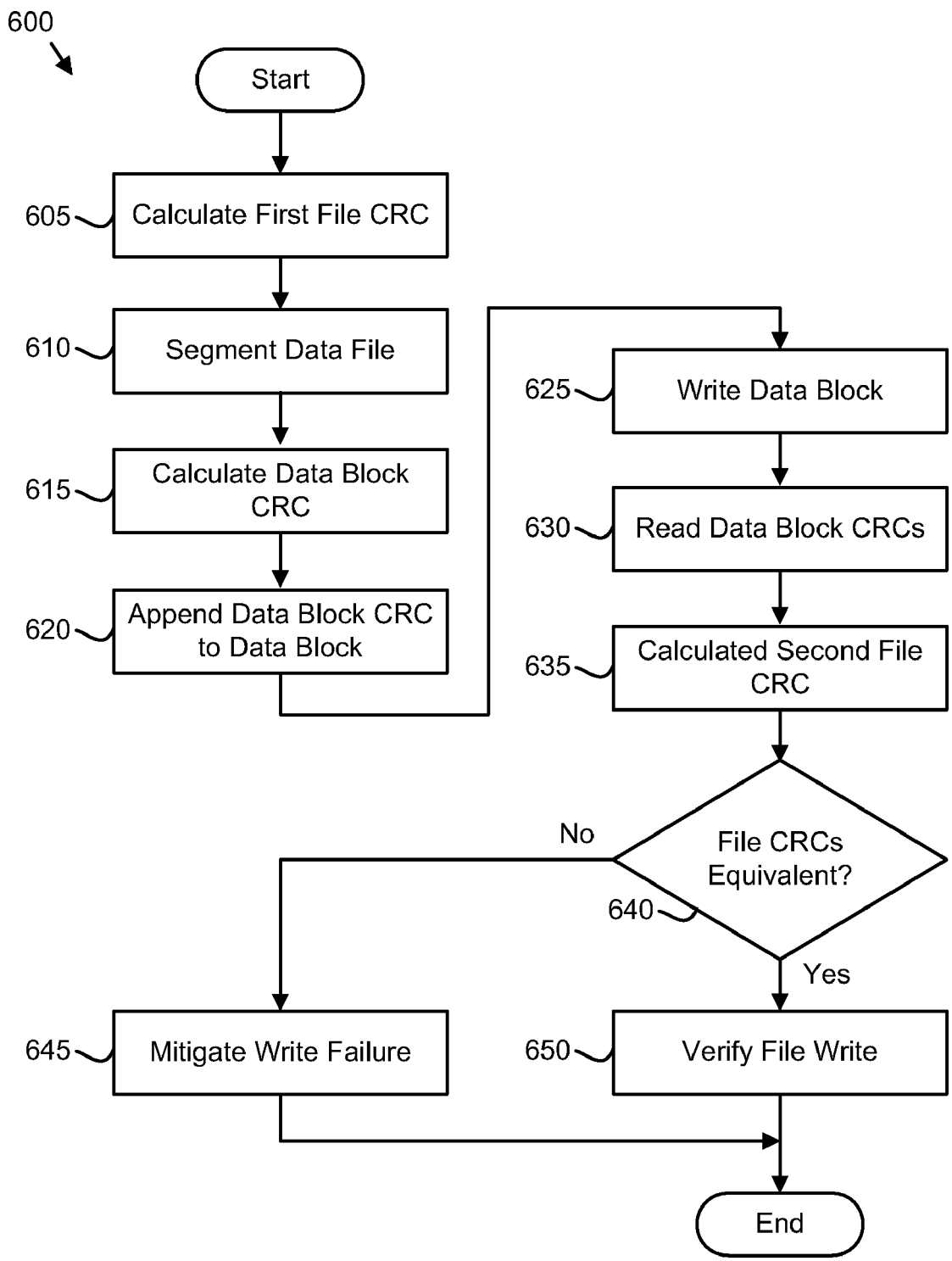
FIG. 6 is a schematic flow chart diagram illustrating one embodiment of a read back verification method of the present invention.

FIG. 6 is a schematic flow chart diagram illustrating one embodiment of a read back verification method 600 of the present invention. The method 600 substantially includes the steps to carry out the functions presented above with respect to the operation of the described apparatus 200, 300, 110, 430 and system 100 of FIGS. 1-5. The description of the method 600 refers to elements of FIGS. 1-5, like numbers referring to like elements.

The method 600 begins and the file CRC module 205 calculates 605 a first file CRC for a data file. In one embodiment, the storage server 110 embodies the file CRC module 205 and employs one or more software processes executing on the processor module 405 to calculate 505 the first file CRC. In an alternate embodiment, the host 105 embodies the file CRC module 205. The host 105 may employ one or more software processes to calculate 505 the first file CRC.

In a certain embodiment, the CRC module 515 of the storage device 430 embodies the file CRC module 205. The CRC module 515 may employ a plurality of semiconductor gates to calculate 505 the first file CRC as is well known to those skilled in the art.

In one embodiment, the file CRC module 205 calculates 605 the first file CRC using a linear checksum. The file CRC module 205 may calculate 605 the first file CRC as Reed-Solomon (N, N-4) codes over $GF(2^8)$ as is well known to those skilled in the art. In one embodiment, $GF(2^8)$ is defined by a polynomial P(x) as shown in Equation 1 where x is data bit with a value of one (1) or zero (0).

$$P(x)=x^8+x^4+x^3+x^2+1 \qquad \text{Equation 1}$$

$GF(2^8)$ further includes a primitive element α, where α is defined by Equation 2.

$$\alpha=(00000010) \qquad \text{Equation 2}$$

In addition, a generator polynomial g(y) is employed, where y is a data byte and g(y) is defined by Equation 3.

$$g(y)=(y+\alpha^{126})(y+\alpha^{127})(y+\alpha^{128})(y+\alpha^{129}) \qquad \text{Equation 3}$$

The generator polynomial g(y) may also be expressed as shown in Equation 4.

$$g(y)=y^4+\alpha^{201}y^3+\alpha^{246}y^2+\alpha^{201}y+1 \qquad \text{Equation 4}$$

The first file CRC is then calculated for the data file using Equation 6, where $[c0\ c_1\ c_2\ \ldots\ c_{A-2}\ c_{A-1}]$ represent the sequence of bytes of the data file, which can also be represented by the polynomial c(y) given in Equation 5.

$$c(y)=c_0y^{A-1}+c_1y^{A-2}+c_2y^{A-3}\ldots+c_{A-2}y+c_{A-1} \qquad \text{Equation 5}$$

In one embodiment, the first file CRC is the four coefficients of the remainder polynomial, as shown in Equation 6.

$$CRC^c(y)R_{g(y)}[y^4c(y)]=CRC^c[3]y^3+CRC^c[2]y^2+CRC^c[1]y+CRC^c[0] \qquad \text{Equation 6}$$

The segmentation module 210 segments 610 the data file into a plurality of data blocks that comprise a copy of the data file. In one embodiment, the size of the data blocks is fixed. In a prophetic example, segmentation module 210 may fix the data block size in the range of one byte (1 B) to sixteen megabytes (16 MB) of data. In an alternate embodiment, the segmentation module 210 segments 610 the data file into data blocks of variable sizes. In a prophetic example, the segmentation module 210 may segment 610 each data block after a delimiter in the data file. In one embodiment, the storage server 110 includes the segmentation module 210. Alternatively, the storage controller may include the segmentation module 210.

A block CRC module 215 calculates 615 a data block CRC for each data block. In one embodiment, the block CRC module 215 may employ Equation 5 to calculate 515 each data block CRC. The block CRC module 215 may be included in the CRC module 515 of the storage device 430. Alternatively, the storage server 110 may include the block CRC module 215.

In one embodiment, the block CRC module 215 appends 620 the data block CRC to the corresponding data block as will be illustrated hereafter. The block CRC module 215 may concatenate the data block CRC to the data block. In addition, the block CRC module 215 may concatenate a data code to delimit the data block CRC.

In one embodiment, the data channel 230 writes 625 each data block with appended data block CRC to a storage medium. In one embodiment, the data channel 230 is the data channel 300 of the tape drive 125 and the storage medium is the magnetic tape 340. The data channel 230 may perform a read-while-write operation when writing 625 each data block to assure that the data block is written reliably to the storage medium. Alternatively, the data channel 230 may write 625 each data block, read back the data block, and verify that the data block is faithfully written. The data blocks written to the storage medium comprise the copy of the data file.

In one embodiment, the data channel 230 also reads 630 each data block CRC from the storage medium. The data channel 230 may read 630 the data block CRCs after writing the data blocks to the storage medium as the data file copy. Alternatively, the data channel 230 may read 630 the data block CRCs as each data block with appended data block CRC is written to the storage medium.

The aggregated CRC module 225 calculates 635 a second file CRC from the block CRCs. The storage server 110 may embody the aggregated CRC module 225. Alternatively, the host 105 may include the aggregated CRC module 225. In a certain embodiment, the storage device 430 includes the aggregated CRC module 225. In a prophetic example, the CRC module 515 may comprise the aggregated CRC module 225.

In a prophetic example with the data file split into two data blocks, a beginning data block and an end data block z bits long, the aggregated CRC module 225 calculates 635 the second file CRC $CRC^c(y)$ from the beginning part of the data file CRC $CRC^b(y)$ and the end part of the data file CRC $CRC^e(y)$ using Equation 7.

$$CRC^c(y)=R_{g(y)}[CRC^b(y)R_{g(y)}[y^{z\,mod\,255}]]+CRC^e(y) \qquad \text{Equation 7}$$

In addition, the aggregated CRC module 225 determines 640 that the copy of the data file is substantially equivalent to the data file. In one embodiment, the aggregated CRC module 225 determines 640 the copy of the data file is substantially equivalent to the data file if the second file CRC is equivalent to the first file CRC. In an alternate embodiment, the aggregated CRC module 225 determines 640 the copy of the data file is substantially equivalent to the data file if the second file CRC is equivalent to zero (0).

If the aggregated CRC module 225 determines 640 that the copy of the data file is substantially equivalent to the data file, the aggregated CRC module 225 verifies 650 the copy of the data file and the method 600 ends. The aggregated CRC module 225 may verify 650 the copy of the data file by communicating a verification message to the host 105.

If the aggregated CRC module 225 determines 640 that the copy of the data file is not substantially equivalent to the data file, the aggregated CRC module 225 may mitigate 645 the write failure and the method 600 ends. In one embodiment, the aggregated CRC module 225 mitigates 645 the write failure by communicating an error message to the host 105. The host 105 may re-communicate the data file to the storage device 430. The method 600 performs a read back verify of the data file copy that reduces the communications and processing bandwidth required for the verification.

Figure 7:
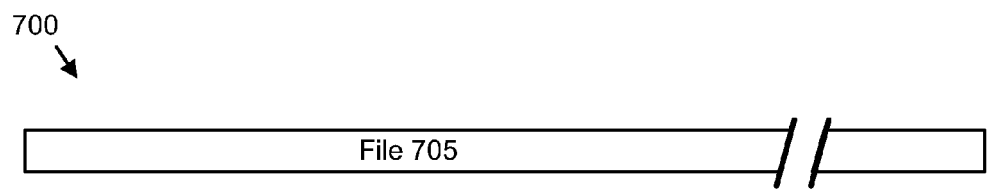
FIG. 7 is a schematic block diagram illustrating one embodiment of a data block segmentation process of the present invention.
Figure 7:
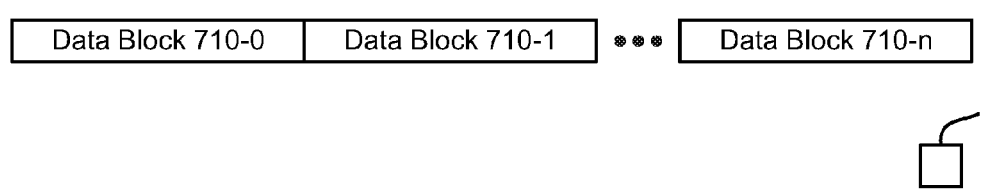

FIG. 7 is a schematic block diagram illustrating one embodiment of a data block segmentation process 700 of the present invention. The process 700 illustrates a prophetic example the method 600, apparatus 200, 300, 110, 430 and system 100 of FIGS. 1-6. In addition, the process 700 refers to elements of FIGS. 1-6, like numbers referring to like elements.

The file CRC module 205 calculates 505 a first file CRC 715a for a data file 705. The segmentation module 210 segments 610 the data file 705 into a plurality of data blocks 710 that comprise a copy of the data file 705.

Figure 8:
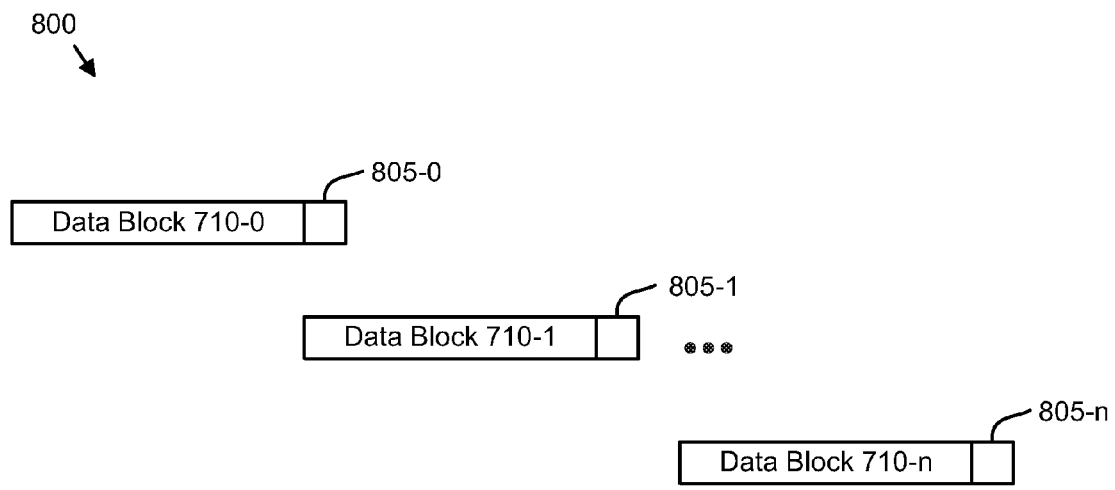
FIG. 8 is a schematic block diagram illustrating one embodiment of data block CRC appending process of the present invention.

FIG. 8 is a schematic block diagram illustrating one embodiment of a data block CRC appending process 800 in accordance the present invention. The process 800 continues the prophetic example of FIG. 7, illustrating the method 600, apparatus 200, 300, 110, 430 and system 100 of FIGS. 1-6. In addition, the process 800 refers to elements of FIGS. 1-7, like numbers referring to like elements.

The block CRC module 215 calculates 615 a data block CRC 805 for each data block 710. In addition, the block CRC module 215 appends 620 each data block CRC 805 to the corresponding data block 710. In the prophetic example, the block CRC module 215 calculates 615 a first data block CRC 805-0 for a first data block 710-0 and appends 620 the first data block CRC 805-0 to the first data block 710-0.

Figure 9:
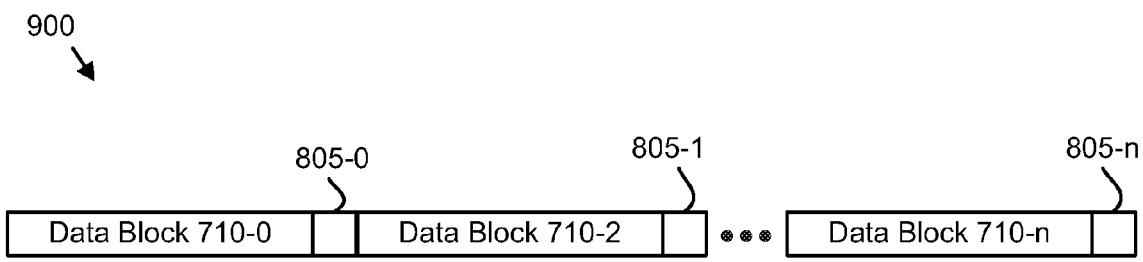
FIG. 9 is a schematic block diagram illustrating one embodiment of a data file copy of the present invention.

FIG. 9 is a schematic block diagram illustrating one embodiment of a data file copy 900 of the present invention. The copy 900 continues the prophetic example of FIGS. 7 and 8. In addition, the description of the copy 900 refers to elements of FIGS. 1-8, like numbers referring to like elements. The data channel 230 may write 625 the data blocks 710 with appended data block CRCs 805 to the storage medium as the data file copy 900, wherein the data blocks 710 together include all the data of the data file 705.

Figure 10:
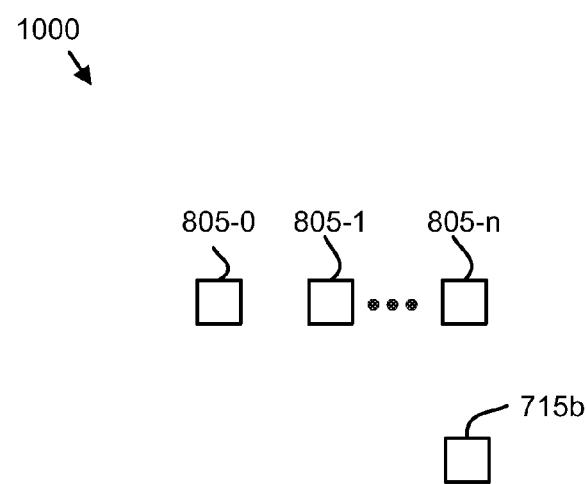
FIG. 10 is a schematic block diagram illustrating one embodiment of read data block CRCs of the present invention.

FIG. 10 is a schematic block diagram illustrating one embodiment of read data block CRCs 1000 of the present invention. The CRCs 1000 continue the prophetic example of FIGS. 7-9. The description of the read data block CRCs 1000 refers to elements of FIGS. 1-9, like numbers referring to like elements.

The data channel 230 may read 630 the CRCs 1000 from the storage medium. The CRCs 1000 represent a significantly smaller quantity of data than the data blocks 710. Thus reading 630 the CRCs 1000 significantly reduces the communications bandwidth required to perform the read back verification of the present invention. In addition, the aggregated CRC module 225 may determine 640 that the copy of the data file 900 and the data file 705 are substantially equivalent by calculating 635 a second file CRC 715b and comparing the second file CRC 715b with the first file CRC 715a, a substantially reduction in processing bandwidth over comparing each byte of the data file 705 with the data file copy 900.

The embodiment of the present invention verifies 650 a data file copy 900 using a read back verify process with reduced communications and processing bandwidth requirements. In addition, the embodiment of the present invention may reduce the size and cost of a storage subsystem required to support read back verification.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for reducing processing bandwidth for read back verification of stored data, the apparatus comprising:
a file CRC module comprising executable code stored on a semiconductor device executed by a processor and configured to calculate a first file CRC for a data file;
a segmentation module comprising executable code stored on the semiconductor device executed by the processor and configured to segment the data file into a plurality of data blocks, each data block beginning after a delimiter in the data file;
a block CRC module comprising executable code stored on the semiconductor device executed by a processor and configured to calculate a data block CRC for each data block and append each data block CRC to the corresponding data block;
an aggregated CRC module comprising executable code stored on the semiconductor device executed by a processor and configured to calculate a second file CRC as a sum of the data block CRCs and verify a copy of the data file in response to the second file CRC being equivalent to the first file CRC.

2. The apparatus of claim 1, further comprising a data channel wherein the data channel is configured to write each data block with appended data block CRC to a storage medium.

3. The apparatus of claim 2, the data channel is further configured to read the data block CRCs from the storage medium.

4. The apparatus of claim 1, wherein the aggregated CRC module is further configured to calculate the second file CRC using Galois field math.

5. The apparatus of claim 1, wherein the file CRC module and the block CRC module calculate each file CRC and data block CRC as a linear checksum.

6. A computer program product comprising executable code stored on a semiconductor device, executed by a processor, and configured to:
calculate a first file CRC for a data file;
segment the data file into a plurality of data blocks comprising a copy of the data file, each data block beginning after a delimiter in the data file;
calculate a data block CRC for each data block;
append each data block CRC to the corresponding data block;
calculate a second file CRC as a sum of the data block CRCs; and
verify the copy of the data file in response to the second file CRC being equivalent to the first file CRC.

7. The computer program product of claim 6, wherein the executable code is further configured to write each data block with appended data block CRC to a storage device.

8. The computer program product of claim 7, wherein the executable code is further configured to read the data block CRCs from the storage device.

9. The computer program product of claim 6, wherein the executable code is further configured to cause the computer to calculate the second file CRC using Galois field math.

10. The computer program product of claim 6, wherein the executable code is further configured to cause the computer to calculate each file CRC and data block CRC as a linear checksum.

11. The computer program product of claim 6, wherein a data block size is variable.

12. The computer program product of claim 6, wherein a data block size is fixed.

13. The computer program product of claim 12, wherein the data block size is in the range of one byte to sixteen megabytes.

14. A system for reducing processing bandwidth for read back verification of stored data, the system comprising:
a storage controller configured to receive a data file and comprising
a file CRC module comprising executable code stored on a storage device executed by a processor and configured to calculate a first file CRC for the data file;
a storage module configured to store the first file CRC;
a segmentation module comprising executable code stored on a storage device executed by a processor and configured to segment the data file into a plurality of data blocks, each data block beginning after a delimiter in the data file;

a storage device comprising
  a storage medium configured to store data;
  a block CRC module comprising executable code stored on a storage device executed by a processor and configured to calculate a data block CRC for each data block and append each data block CRC to the corresponding data block;
  a data channel comprising semiconductor logic and configured to write each data block with appended data block CRC to the storage medium as a copy of the data file and read the data block CRCs from the storage medium; and
the storage controller further comprising
  an aggregated CRC module comprising executable code stored on a storage device by a processor and configured to calculate a second file CRC as a sum of the data block CRCs and verify the copy of the data file in response to the second file CRC being equivalent to the stored first file CRC.

15. The system of claim 14, wherein the file CRC module and the block CRC module calculate each file CRC and data block CRC as a linear checksum.

16. The system of claim 15, wherein the aggregated CRC module is further configured to calculate the second file CRC using Galois field math.

17. The system of claim 16, wherein the storage device is configured as a magnetic tape drive.

18. A method for deploying computer infrastructure, comprising integrating computer-readable code into a computing system, wherein the code in combination with the computing system performs the following:
  calculating a first file CRC for a data file;
  segmenting the data file into a plurality of data blocks, each data block beginning after a delimiter in the data file;
  calculating a data block CRC for each data block;
  appending each data block CRC to the corresponding data block;
  writing each data block with appended data block CRC to a storage device as a copy of the data file;
  reading the data block CRCs from the storage device;
  calculating a second file CRC as a sum of the data block CRCs; and
  verifying the copy of the data file in response to the second file CRC being equivalent to the first file CRC.

* * * * *